(12) United States Patent
Rendler et al.

(10) Patent No.: US 12,610,628 B2
(45) Date of Patent: Apr. 21, 2026

(54) SOLAR-CELL MODULE

(71) Applicant: Fraunhofer-Gesellschaft zur Förderung der angewandten Forschung e.V., Munich (DE)

(72) Inventors: Li Carlos Rendler, Freiburg (DE); Christian Reichel, Freiburg (DE); Nils Klasen, Freiburg (DE); Ammar Tummalieh, Freiburg (DE); Dirk Holger Neuhaus, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/861,306

(22) PCT Filed: Apr. 17, 2023

(86) PCT No.: PCT/EP2023/059913
§ 371 (c)(1),
(2) Date: Oct. 29, 2024

(87) PCT Pub. No.: WO2023/208629
PCT Pub. Date: Nov. 2, 2023

(65) Prior Publication Data
US 2025/0351587 A1 Nov. 13, 2025

(30) Foreign Application Priority Data
Apr. 29, 2022 (DE) .......................... 102022110490.7

(51) Int. Cl.
*H10F 19/90* (2025.01)
*H10F 19/70* (2025.01)

(52) U.S. Cl.
CPC ........... *H10F 19/902* (2025.01); *H10F 19/70* (2025.01)

(58) Field of Classification Search
CPC ............................... H10F 19/902; H10F 19/70
See application file for complete search history.

(56) References Cited

U.S. PATENT DOCUMENTS

| | | | |
|---|---|---|---|
| 2010/0012172 A1 | 1/2010 | Meakin et al. | |
| 2015/0349167 A1* | 12/2015 | Morad .................. | H10F 19/804 136/251 |
| 2017/0179324 A1 | 6/2017 | Yang et al. | |
| 2019/0028057 A1 | 1/2019 | Huang | |
| 2020/0105954 A1* | 4/2020 | Maki ................. | B32B 17/10788 |

FOREIGN PATENT DOCUMENTS

| | | |
|---|---|---|
| DE | 102005012213 B4 | 1/2009 |
| DE | 102009060604 A1 | 6/2011 |
| DE | 202013005357 U1 | 9/2014 |
| DE | 102020128080 B4 | 7/2022 |
| FR | 3086102 B1 | 7/2022 |
| WO | 2015001413 A1 | 1/2015 |

* cited by examiner

*Primary Examiner* — Mayla Gonzalez Ramos
(74) *Attorney, Agent, or Firm* — Volpe Koenig

(57) ABSTRACT

A solar cell module, having a plurality of module segments, wherein the module segments have at least two subsegments which each have at least one first solar cell string and each solar cell string has a plurality of solar cells interconnected in series.

17 Claims, 7 Drawing Sheets

A - A

SOLAR-CELL MODULE

CROSS-REFERENCE TO RELATED APPLICATIONS

This application is a 371 National Phase pf PCT/EP2023/059913, filed Apr. 17, 2023, which claims priority to German Patent Application No. 10 2022 110 490.7, filed Apr. 29, 2022, both of which are incorporated herein by reference as if fully set forth.

TECHNICAL FIELD

The invention relates to a solar cell module. Solar cells are sensitive semiconductor components. In order to protect them against environmental influences over the long term and to achieve manageable electrical output parameters, solar cells are typically electrically interconnected and encapsulated in a module structure.

BACKGROUND

One problem with the use of solar cell modules is partial shading, in the case of which individual solar cells are completely or partially shaded, for example due to soiling or due to objects casting shade on the solar cell module. In the case of partial shading, the electrical output power of the entire solar cell module can firstly be significantly reduced or fall to zero. Secondly, partial shading can lead to significant heating of the partially shaded solar cell, and therefore there is a risk of damage to the solar cell and the module structure.

It is therefore known to interconnect bypass diodes in parallel to form a plurality of solar cells, so that in the case of partial shading in a subregion of the solar cell module, the solar cells in this subregion are bridged via the bypass diode.

Therefore, a solar cell module typically has a plurality of module segments, wherein each module segment has at least one solar cell string. This solar cell string has a plurality of solar cells connected in series.

DE202013005357U1 and US20100012172A1 disclose different configurations of module segments of a solar cell module, wherein at least one bypass diode connected in parallel is assigned to each module segment. WO2015/001413 discloses a solar cell module having a plurality of module segments and bypass diodes arranged centrally in the solar cell module.

The previously known module layouts have the disadvantage that high power losses can occur in the case of shading along an edge of the solar cell module. The high power loss occurs with previously known module layouts because, when the respective edge of the module is shaded, the bypass diodes of the affected module segment cause the module segment to be bridged. Owing to the power losses in specific shading scenarios, the flexibility of the orientation is limited in previously known module layouts since, particularly in the case of solar installations, in particular in the case of solar power plants, the arrangement in rows of solar modules may cause extensive shading of rows of solar modules given a low sun position. This shading scenario leads to increasing shading of the solar modules on one side, this shading extending over parts of the module starting from an edge of the module.

SUMMARY

The object of the present invention is to provide a module layout which has lower power losses in the case of shading along an edge, in particular a short edge, of a rectangular solar cell module.

This object is achieved by a solar cell module having one or more of the features disclosed herein. Advantageous embodiments are found below in the description and claims.

The solar cell module according to the invention has module segments connected in series via segment connectors. Wherein each of the module segments has at least two subsegments. The two subsegments of the module segments are interconnected in series via subsegment connectors. The subsegments each have at least one first solar cell string. Each of the solar cell strings is composed of a plurality of solar cells interconnected in series, wherein the solar cells of the solar cell module are arranged in such a way that the solar cell module forms a relatively short edge and a relatively long edge.

It is essential here that the solar module has at least four module segments, wherein each module segment has at least two subsegments, which are connected in series by a subsegment connector, wherein each of the subsegments has a first and at least a second solar cell string. In addition, it is essential that the solar cell strings of each of the subsegments are connected in parallel by means of an internal string connector and an external string connector. Here, "internally" describes arrangement in a central region on the surface of the solar module. Here, "externally" describes a position at the upper or lower edge of the surface extent of the solar module. It is additionally essential that the solar cell strings each have a plurality of solar cells connected in series, and that the solar cell strings extend parallel to the short edge of the solar cell module. It is additionally essential that the at least four module segments are arranged in a matrix which has at least two rows and at least two columns, wherein each row and each column has at least two of the at least four module segments; it is essential here that the subsegments of the module segments with alternating current directions are arranged in each row, so that subsegments situated next each other in a row have opposite current directions, wherein the sequence of current directions of the subsegments is the same in the first and the second row.

In contrast to previously known configurations, the solar cell module according to the invention therefore has at least four module segments connected in series, each of which has at least two subsegments, wherein the subsegments of the module segments are arranged with alternating current directions in each row, so that subsegments situated next each other in a row have opposite current directions and the sequence of current directions of the subsegments is the same in the first and the second row.

In the majority of the configurations known from the prior art, considerable power losses occur in the case of shading along the short edge of the module. The positioning of the module segments is critical here.

The solar cell module according to the invention enables arrangement of the module segments, so that the solar cells of the solar cell strings extend along the short edge of the module and the module segments are arranged in a matrix. It is advantageous here that only the individual module segments of the affected solar cells fail the arrangement in the case of partial shading. Owing to the arrangement in rows and columns as well as owing to the module segments being interconnected according to the invention, only one module segment of a row or a column fails. This increases the performance in certain shading scenarios and the yield of the entire installation is potentially higher than with conventional solar module layouts.

In addition, this arrangement reduces the risk of hotspots caused by relatively short solar cell strings. It is additionally advantageous that the voltage load on the bypass elements is reduced in the case of bridging, so that the bypass elements exhibit lower power losses. Simply adjusting the number of solar cells per solar cell string or changing the number of solar cell strings connected in parallel per subsegment has the advantage that flexible design of the module size is possible. A further advantage of arranging the solar cell strings along the short module edges is that lower mechanical stresses occur in the solar cells in the event of mechanical loading.

The matrix advantageously has exactly two rows. This results in the advantage that the segment connectors can be arranged in a common central region between the two rows.

In one advantageous embodiment, the module segments each have a bypass element. This bypass element is connected in parallel with the subsegments of a module segment. This bypass element is required because high negative voltages occur in the case of shading of a solar cell. This is the case if the current at the working point of the respective cell line is above the short-circuit current of the shaded cell. A current flows through the bypass element and the negative voltages at the subsegments are limited and therefore the voltage at the shaded solar cells is also limited. Owing to this advantageous configuration, a residual output power of the solar cell module remains through the other module segments, even when an entire solar cell is shaded.

An advantageous design is found in an embodiment in which a plurality of the external string connectors and subsegment connectors are arranged in an edge region of the solar cell module, and a plurality of the internal string connectors and segment connectors are arranged in a central module region.

In particular, it is advantageous that all subsegment connectors are arranged externally, in particular between an edge of the module and a subsegment.

This has the advantage that flexible expansion of the module layout with supplementary module segments is possible in a simple manner.

An advantageously structurally simple design is found in an advantageous embodiment in which the segment connectors, which interconnect module segments of two adjacent rows in series, are additionally formed as the internal string connectors of the interconnected subsegments of the respective module segments.

It is advantageous in the embodiment that therefore only one element at a time is required for connection; in addition, this segment connector can be accommodated within the encapsulation.

A particularly advantageous design is found in an embodiment in which the internal string connectors and internal segment connectors of the module segments of a first row are arranged on a first plane, and the internal string connectors of a second row are arranged on a second plane, which is spaced from the first plane, and are separated from each other via an electrically non-conductive insulation layer, preferably in which the planes are arranged within the encapsulation material, in particular the internal string connectors of the second row are arranged so as to overlap with the internal string connectors and internal segment connectors. The planes are arranged parallel to the front side.

One advantage of this design is the space-saving accommodation of the connectors since the connectors are arranged one above the other in the internal region of the solar module. Therefore, the surface utilization can be improved and therefore the surface power density can be increased.

In a further advantageous embodiment, the solar module has a plurality of contact feedthroughs. These contact feedthroughs are primarily advantageous in the above-described embodiment with the connectors situated one above the other. The contact feedthroughs are used for contacting of the connectors through the planes to the rear side of the solar module. The contact feedthroughs are preferably arranged centrally, in particular centrally between two module segments. Preferably the contacting of the string connectors, particularly preferably the contacting of the segment connectors.

One advantage of the design with contact feedthroughs is that it is possible to route a plurality of contacts through a contact feedthrough to the rear side of the solar module and therefore to use shorter connectors, this reducing electrical series resistance losses and costs. A further advantage of the design with contact feedthroughs is that the subsegments of a column can be easily interconnected within junction boxes.

A design particularly optimized for partial shading is found in an advantageous development in which the module segments each have a first and an at least second bypass element, which each have a first and a second pole, wherein the first pole of the first bypass element of a module segment is connected to a first pole of the first subsegment of the module segment, and the second pole of the second bypass element of the module segment is electrically conductively connected to a second pole of the second subsegment of the module segment, and the second pole of the first bypass element of the module segment and the first pole of the second bypass element of the first module segment is electrically conductively connected to the subsegment connector of the module segment by means of a bypass connector.

Here, only the respectively affected subsegment of a module segment fails in the case of shading along the short edge of the solar module. This increases the performance in certain shading scenarios and the yield of the entire installation is potentially higher than with conventional solar module layouts. A further advantage is that this arrangement reduces the risk of hotspots caused by relatively short solar cell strings. It is additionally advantageous that the voltage load on the bypass elements is reduced in the case of bridging, so that the bypass elements exhibit lower power losses.

In a further advantageous embodiment, a plurality of the bypass elements, preferably bypass elements and the segment connectors, which electrically connect adjacent module segments of a column to each other, are positioned in junction boxes, in particular bypass elements which are associated with module segments which belong to the same column.

The advantage of this embodiment is the efficient arrangement of the junction boxes. This is because the connections of the elements are kept short and interconnected in the middle of the solar module. Therefore, the connector connections can be kept as short as possible and the number of junction boxes can be kept small, thus reducing costs.

The number of module segments of the first row advantageously corresponds to the number of module segments of the second row. The advantage here is that simple production of solar modules can therefore be implemented. The solar cell strings of a subsegment of a module segment advantageously have the same number of solar cells. This easily makes it possible for all subsegments to supply the same electrical voltage under standard conditions, so that there is no mismatch and therefore no loss due to different voltages of the individual subsegments.

It is additionally advantageous that the individual module segments of a solar module have the same number of solar cell strings and the solar cell strings each have the same number of solar cells. It is also easily possible here for all module segments to supply the same current under standard conditions, so that there is no mismatch and therefore no loss due to different currents of the individual module segments. An additional advantage is that all bypass elements of an identical number of solar cells interconnected in series are connected in parallel. The same or similar bypass elements can therefore be used.

In one advantageous embodiment, the module segments are arranged next to each other in parallel and connected electrically in series at a first edge region of the solar module, in particular by means of a subsegment connector, preferably by means of a linear subsegment connector, and the module segments are connected electrically in series in a region not located at the edge of the solar module, in particular by means of segment connectors, preferably linear segment connectors. The parallel arrangement of the subsegments is advantageous since ideal surface utilization of the solar cell module is implemented in this way. Furthermore, it is advantageous that the junction boxes can also be positioned centrally owing to the central arrangement of the segment connectors.

In a further advantageous embodiment, the solar module has four module segments in the first row, the four module segments each being interconnected in series via segment connectors. Similarly, four module segments are arranged in the second row, wherein in each case two of the four module segments are interconnected in series via segment connectors. The first two module segments of the second row and also the two last module segments of the second row are preferably connected via segment connectors and the module segments of the first and last columns of the rows are connected in series via segment connectors.

This results in the advantage that expansion of the configuration can be implemented in a structurally simple manner by adding module segments. A further advantage of this particularly advantageous embodiment is the simple scalable expansion of several module segments to form a larger solar module with an increased output power.

A further advantageous embodiment, which leads in particular to advantageous scalability of the solar module, has three module segments in the first row, each of which are interconnected in series via segment connectors. Three module segments are likewise arranged in the second row, wherein two of the three module segments are interconnected in series via segment connectors.

In this embodiment, the module segments of the first and last columns of the rows are connected in series via segment connectors.

This likewise results in the advantage that an expansion of the configuration can be implemented structurally very easily by adding module segments.

A simple embodiment has two module segments in the first row and second row, each of which module segments are interconnected in series via segment connectors. In this embodiment, the module segments of the first or the last column of the rows are connected in series via segment connectors.

This results in the advantage that the arrangement is very compact and, despite complete shading of a solar cell, there is always a residual output power of the solar cell module. The residual output power exists because the unshaded module segments are not adversely affected and continue to contribute to an output line.

The number of solar cells of each solar cell string is advantageously in the range of from 3 to 65 solar cells.

Solar cells with the same performance data, in particular the same voltage and current at the optimum operating point under standard conditions, within the scope of the usual manufacturing tolerances are advantageously used for all subsegments.

The number of solar cell strings of the subsegments is advantageously in the range of from two to eight solar cell strings per subsegment.

This results in the advantage that a desired output current can be selected for each module segment with standard illumination by a corresponding number of solar cell strings.

The bypass elements can be formed in a manner known per se, in particular formation of the bypass elements as diodes, in particular Schottky diodes, as MOSFETs or as electronic switching devices and/or integrated circuits, in particular according to DE 102005012213 A1 and/or DE 10 2009 060 604 A1, also lies within the scope of the invention.

The scope of the invention covers the solar cell module being structurally formed in a manner known per se. In particular, the scope of the invention covers the solar cells of the solar cell module being arranged on a support plate and an optically transparent covering layer that is known per se for encapsulating the solar cells being arranged on the side facing the incident light during use. Furthermore, electrical contacts for interconnecting the solar cell module are preferably arranged in a circuit on the rear side of the solar cell module, in particular for interconnection with further solar cell modules.

The scope of the invention covers using solar cells that are known per se for converting incident radiation into electrical energy, in particular using solar cells which cover more than two band gaps.

In particular, the use of partial solar cells, which are formed by the division of a larger base solar cell, in particular half- or third-cells, as solar cells is covered by the scope of the invention.

The scope of the invention covers the solar cells of a solar cell string being interconnected in series using the methods known per se. In particular, the solar cells can be arranged using the shingle technique, in particular the solar cells are connected by means of conductive adhesive or solder.

The solar cells can have, as absorbent material, a semiconductor material and one or more pn-junctions for separating the charge carriers. The scope of the invention further covers using solar cells based on materials from main groups III and V of the periodic table (so-called III/V solar cells) or solar cells based on perovskite, in particular in combination with other materials.

Photovoltaic solar cells, in particular photovoltaic solar cells based on a silicon substrate, are advantageously used for forming the solar cell strings. This means that solar cells that are known per se and are commercially available can be used.

The scope of the invention covers using bifacial solar cells for forming the solar cell strings. Such solar cells are designed for absorbing light from the front and the rear side of the solar cell. In this embodiment, the solar cell module preferably has optically transparent layers on the front and the rear side of the solar cell module, so that radiation, in particular sunlight, both from the front side and from the rear side of the solar cell module hits the solar cells through the encapsulation layers of the solar cell module.

BRIEF DESCRIPTION OF THE DRAWINGS

Further preferred features and embodiments are explained below with reference to exemplary embodiments and figures.

DETAILED DESCRIPTION

The figures show schematic illustrations or arrangements that are not true to scale. The same reference signs in the figures denote elements that are the same or have the same effect.

Figure 1:
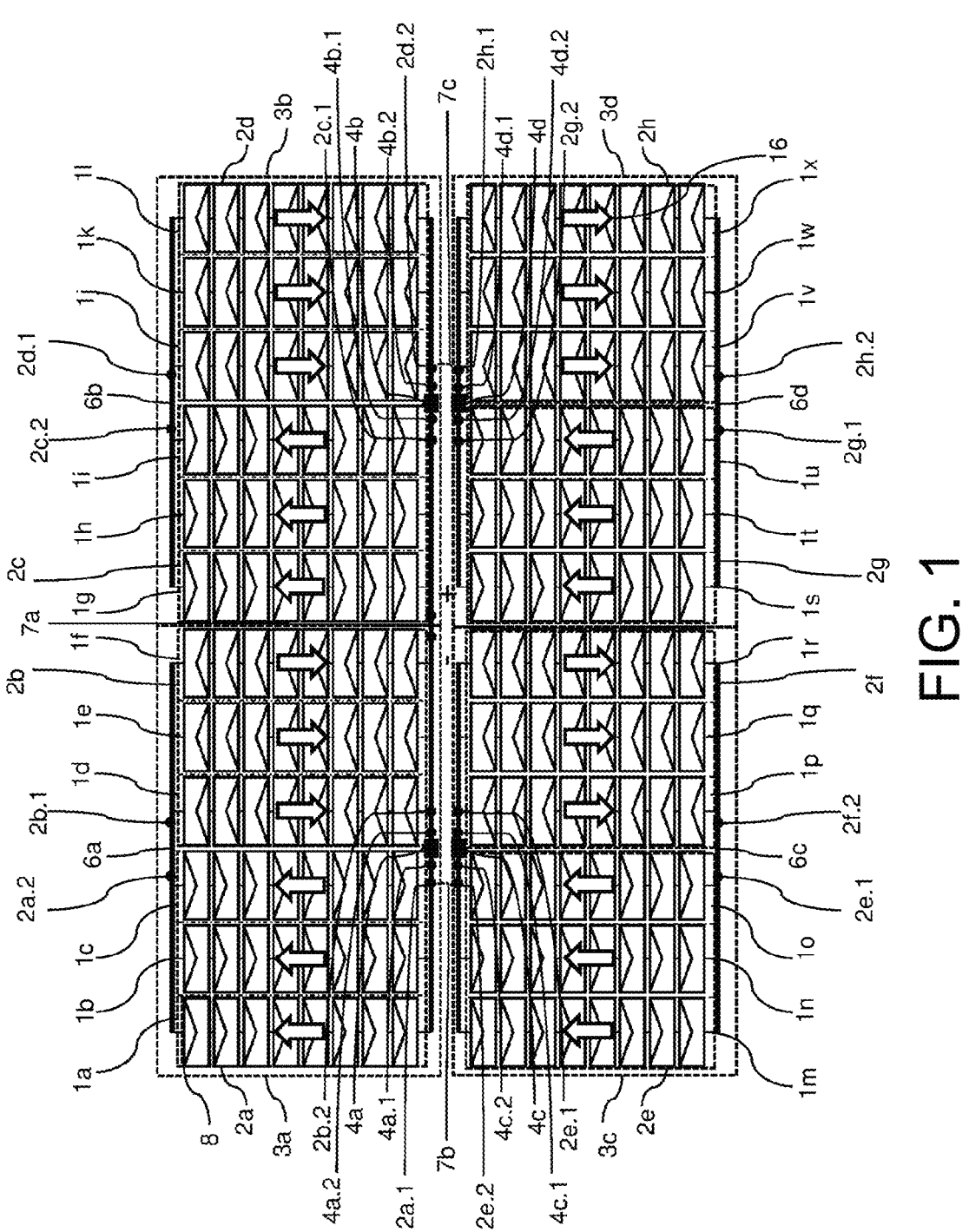
FIGS. 1 to 4, 5A, 5B, and 6 each show an exemplary embodiment of a solar cell module according to the invention.

The exemplary embodiment of a solar cell module according to the invention shown in FIG. 1 has four module segments 3*a*, 3*b*, 3*c* and 3*d*. The subsegments 2*a* and 2*b* are assigned to the module segments 3*a*, the subsegments 2*c* and 2*d* are assigned to the module segment 3*b*, subsegments 2*e* and 2*f* are assigned to the module segment 3*c*, and the subsegments 2*g* and 2*h* are assigned to the module segment 3*d* by dashed lines in each case.

The solar cell strings 1*a*, 1*b* and 1*c* are assigned to the subsegment 2*a*, and a large number of solar cells 8 are assigned to each of these solar cell strings. The solar cell strings 1*d*, 1*e* and 1*f* are assigned to the subsegment 2*b*, and a large number of solar cells 8 are assigned to each of these solar cell strings. The solar cell strings 1*g*, 1*h* and 1*i* are assigned to the subsegment 2*c* and a large number of solar cells 8 are assigned to each of these solar cell strings. The solar cell strings 1*j*, 1*k* and 1*l* are assigned to the subsegment 2*d*, and a large number of solar cells 8 are assigned to each of these solar cell strings. The solar cell strings 1*m*, 1*n* and 1*o* are assigned to the subsegment 2*e*, and a large number of solar cells 8 are assigned to each of these solar cell strings. The solar cell strings 1*p*, 1*q* and 1*r* are assigned to the subsegment 2*f*, and a large number of solar cells 8 are assigned to each of these solar cell strings. The solar cell strings 1*s*, 1*t* and 1*u* are assigned to the subsegment 2*g*, and a large number of solar cells 8 are assigned to each of these solar cell strings. The solar cell strings 1*v*, 1*w* and 1*x* are assigned to the subsegment 2*h*, and a large number of solar cells 8 are assigned to each of these solar cell strings.

By way of example, the number of solar cells 8 in the solar cell strings 1*a* to 1*x* is 8. The solar cells are schematically illustrated by a triangle arranged in a rectangle. This schematic illustration represents the equivalent circuit diagram of a solar cell. The underlying equivalent circuit diagram is based on the general procedure description within a solar cell using the two-diode model. Here, the orientation of the triangle within the rectangle refers to the diode arrangement of the two diodes within the equivalent circuit diagram. The technical current flow direction within the solar cell therefore corresponds to a direction directed in the opposite direction to the triangle orientation.

The solar cell strings 1*a*, 1*b* and 1*c* are arranged interconnected in parallel in subsegment 2*a*. The solar cell strings 1*d*, 1*e* and 1*f* are arranged interconnected in parallel in subsegment 2*b*. The solar cell strings 1*g*, 1*h* and 1*i* are arranged interconnected in parallel in subsegment 2*c*. The solar cell strings 1*j*, 1*k* and 1*l* are arranged interconnected in parallel in subsegment 2*d*. The solar cell strings 1*m*, 1*n* and 1*o* are arranged interconnected in parallel in subsegment 2*e*. The solar cell strings 1*p*, 1*q* and 1*r* are arranged interconnected in parallel in subsegment 2*f*. The solar cell strings 1*s*, 1*t* and 1*u* are arranged interconnected in parallel in subsegment 2*g*. The solar cell strings 1*v*, 1*w* and 1*x* are arranged interconnected in parallel in subsegment 2*h*.

A subsegment connector 6*a* is arranged between subsegment 2*a* and subsegment 2*b*. This subsegment connector 6*a* establishes an electrically conductive connection between the pole 2*a*.2 of the subsegment 2*a* and the pole 2*b*.1 of the subsegment 2*b*. A subsegment connector 6*b* is arranged between subsegment 2*c* and subsegment 2*d*. This subsegment connector 6*b* establishes an electrically conductive connection between the pole 2*c*.2 of the subsegment 2*c* and the pole 2*d*.1 of the subsegment 2*d*. A subsegment connector 6*c* is arranged between subsegment 2*e* and subsegment 2*f*. This subsegment connector 6*c* establishes an electrically conductive connection between the pole 2*d*.2 of the subsegment 2*d* and the pole 2*e*.1 of the subsegment 2*e*. A subsegment connector 6*d* is arranged between subsegment 2*g* and subsegment 2*h*. This subsegment connector 6*d* establishes an electrically conductive connection between the pole 2*g*.2 of the subsegment 2*g* and the pole 2*h*.1 of the subsegment 2*h*.

The pole 4*a*.1 of the bypass element 4*a* is electrically conductively connected to the pole 2*a*.1 of the subsegment 2*a*. The pole 4*a*.2 of the bypass element 4*a* is electrically conductively connected to the pole 2*b*.2 of the subsegment 2*b*. The pole 4*b*.1 of the bypass element 4*b* is electrically conductively connected to the pole 2*c*.1 of the subsegment 2*c*. The pole 4*b*.2 of the bypass element 4*b* is electrically conductively connected to the pole 2*d*.2 of the subsegment 2*d*. The pole 4*c*.1 of the bypass element 4*c* is electrically conductively connected to the pole 2*e*.2 of the subsegment 2*e*. The pole 4*c*.2 of the bypass element 4*a* is electrically conductively connected to the pole 2*f*.1 of the subsegment 2*f*. The pole 4*d*.1 of the bypass element 4*d* is electrically conductively connected to the pole 2*g*.2 of the subsegment 2*g*. The pole 4*d*.2 of the bypass element 4*d* is electrically conductively connected to the pole 2*h*.1 of the subsegment 2*h*.

The bypass elements 4*a*, 4*b*, 4*c* and 4*d* are each in the form of a bypass diode. The scope of the invention likewise covers forming the bypass elements as described above, for example as a MOSFET in each case, in an alternative embodiment.

The module segment 3*a* is electrically conductively connected to the module segment 3*b* via a segment connector 7*a*. Here, the segment connector 7*a* connects the pole 2*b*.2 of the subsegment 2*b* of the module segment 3*a* to the pole 2*c*.1 of the subsegment 2*c* of the module segment 3*b*. The module segment 3*a* is electrically conductively connected to the module segment 3*c* via a segment connector 7*b*. Here, the segment connector 7*b* connects the pole 2*a*.1 of the subsegment 2*a* of the module segment 3*a* to the pole 2*e*.2 of the subsegment 2*e* of the module segment 3*c*. The module segment 3*b* is electrically conductively connected to the module segment 3*d* via a segment connector 7*c*. Here, the segment connector 7*c* connects the pole 2*d*.2 of the subsegment 2*d* of the module segment 3*b* to the pole 2*h*.1 of the subsegment 2*h* of the module segment 3*d*.

In addition to the interconnection arrangement, the exemplary embodiment, from a top view, has a layout described as follows. The four module segments are arranged in a matrix. The module segments 3*a* and 3*b* are situated next to each other, wherein the module segment 3*b* is situated to the right of the module segment 3*a*. The module segments therefore form a first matrix row, the subsegments 2*a* to 2*d* of the module segments 3*a* and 3*b* being arranged parallel to each other, so that the solar cells 8 of the solar cell strings 1*a* to 1*l* arranged in series are also arranged parallel to each other. The module segments 3*c* and 3*d* are situated next to each other, wherein the module segment 3*d* is situated to the right of the module segment 3*c*. The module segments therefore form a second matrix row, the subsegments 2*e* to 2*h* of the module segments 3*c* and 3*d* being arranged parallel to each other, so that the solar cells 8 of the solar cell strings 1e to 1x arranged in series are also arranged parallel to each other. The subsegments each have a current direction, wherein the subsegments of the module segments with alternating current directions are arranged in each row, so that subsegments situated next to each other in a row have opposite current directions. The current direction of the subsegment 2a runs from the pole 2a.1 to the pole 2a.2. The current direction of the subsegment 2b runs from the pole 2b.1 to the pole 2b.2. The current direction of the subsegment 2c runs from the pole 2c.1 to the pole 2c.2. The current direction of the subsegment 2d runs from the pole 2d.1 to the pole 2d.2. The current direction of the subsegment 2e runs from the pole 2e.1 to the pole 2e.2. The current direction of the subsegment 2f runs from the pole 2f.1 to the pole 2f.2. The current direction of the subsegment 2g runs from the pole 2g.1 to the pole 2g.2. The current direction of the subsegment 2h runs from the pole 2h.1 to the pole 2h.2. The sequence of the current directions of the subsegments in the first row and the second row are therefore the same.

The solar module comprises two matrix columns, the first column including the module segments 3a and 3c. The second column includes the module segments 3b and 3d.

The subsegment connectors 6a and 6b extend at the upper edge region of the first row of the matrix. The subsegment connectors 6c and 6d extend at the lower edge region of the second row of the matrix.

The segment connector 7a extends at the lower region of the first row of the matrix. The segment connectors 7b and 7c extend from the first row to the second row.

The position at which the positive and the negative contact for interconnecting the solar cell module with an external circuit, in particular with further solar cell modules, are arranged on the rear side of the solar cell module is schematically identified by symbols "+" and "−" in the middle of FIG. 1. The scope of the invention, in the exemplary embodiment shown in FIG. 1 and also in the exemplary embodiments shown in the other figures, covers the respective polarity of the contacts of the solar module being reversed when a solar cell direction arrangement is reversed.

Figure 2:
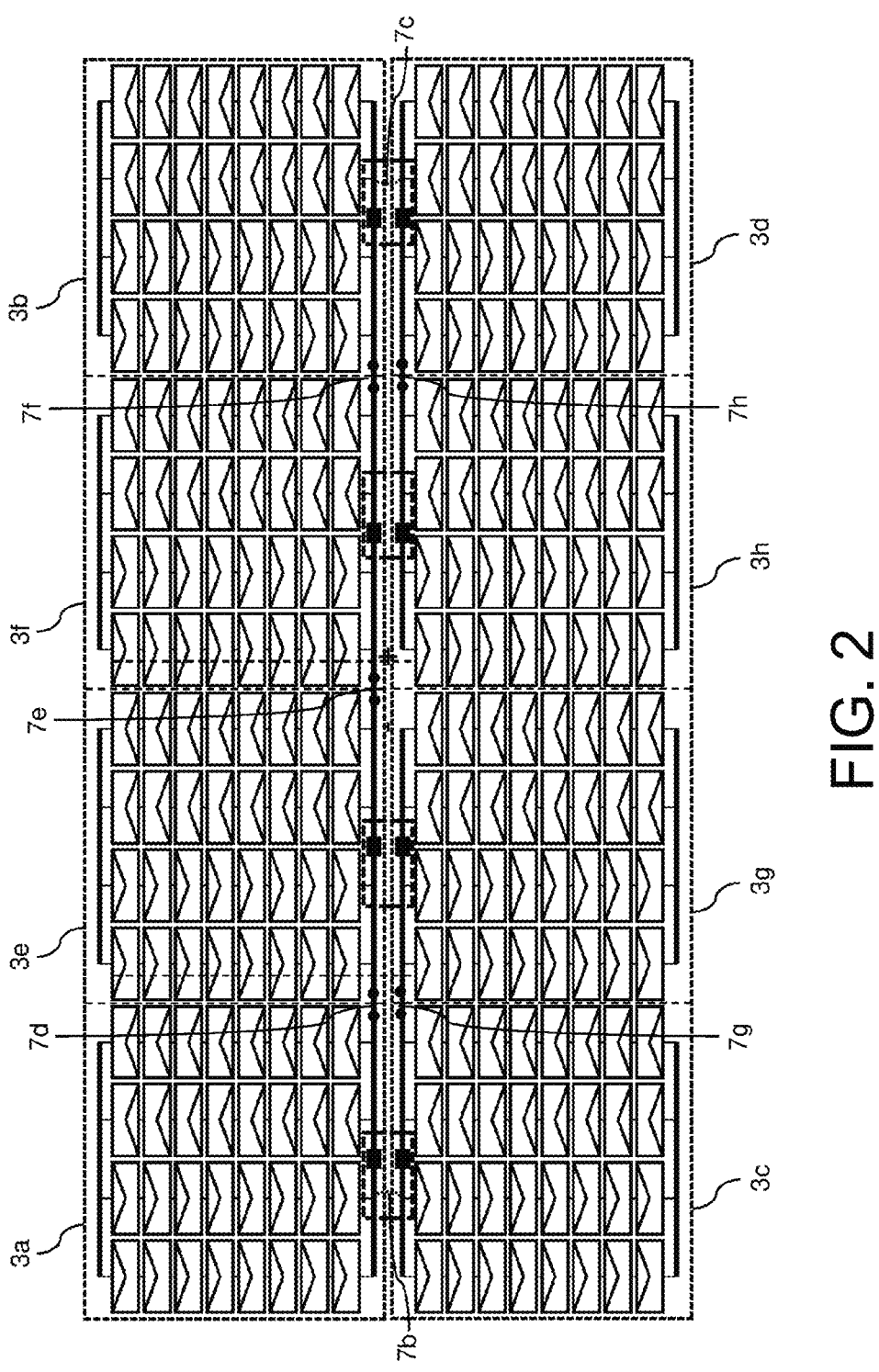

FIGS. 2 to 4, 5A, 5B, and 6 each show modified exemplary embodiments. In order to avoid repetitions, only the essential differences from the exemplary embodiment shown in FIG. 1 are discussed below:

In the exemplary embodiment shown in FIG. 2, the module segments 3a and 3b and also 3c and 3d each have a further module segment 3e and 3f and also 3g and 3h. The further module segment 3e is electrically conductively connected to the module segment 3a via the segment connector 7d and to the module segment 3f by way of the segment connector 7e. The further module segment 3f is electrically conductively connected to the module segment 3b via the segment connector 7f. The further module segment 3g is electrically conductively connected to the module segment 3c via the segment connector 7g. The further module segment 3h is electrically conductively connected to the module segment 3d via the segment connector 7h. The module segment 3a is electrically conductively connected to the module segment 3c via the segment connector 7b. The further module segment 3b is electrically conductively connected to the module segment 3d via the segment connector 7c.

The module segments 3e and 3g are arranged to the right next to the module segments 3a and 3c. The module segments 3f and 3h are arranged to the left next to the module segments 3b and 3d. This results in the advantage that expansion of the configuration shown in exemplary embodiment 1 can be implemented in a structurally simple manner by adding module segments.

Figure 3:
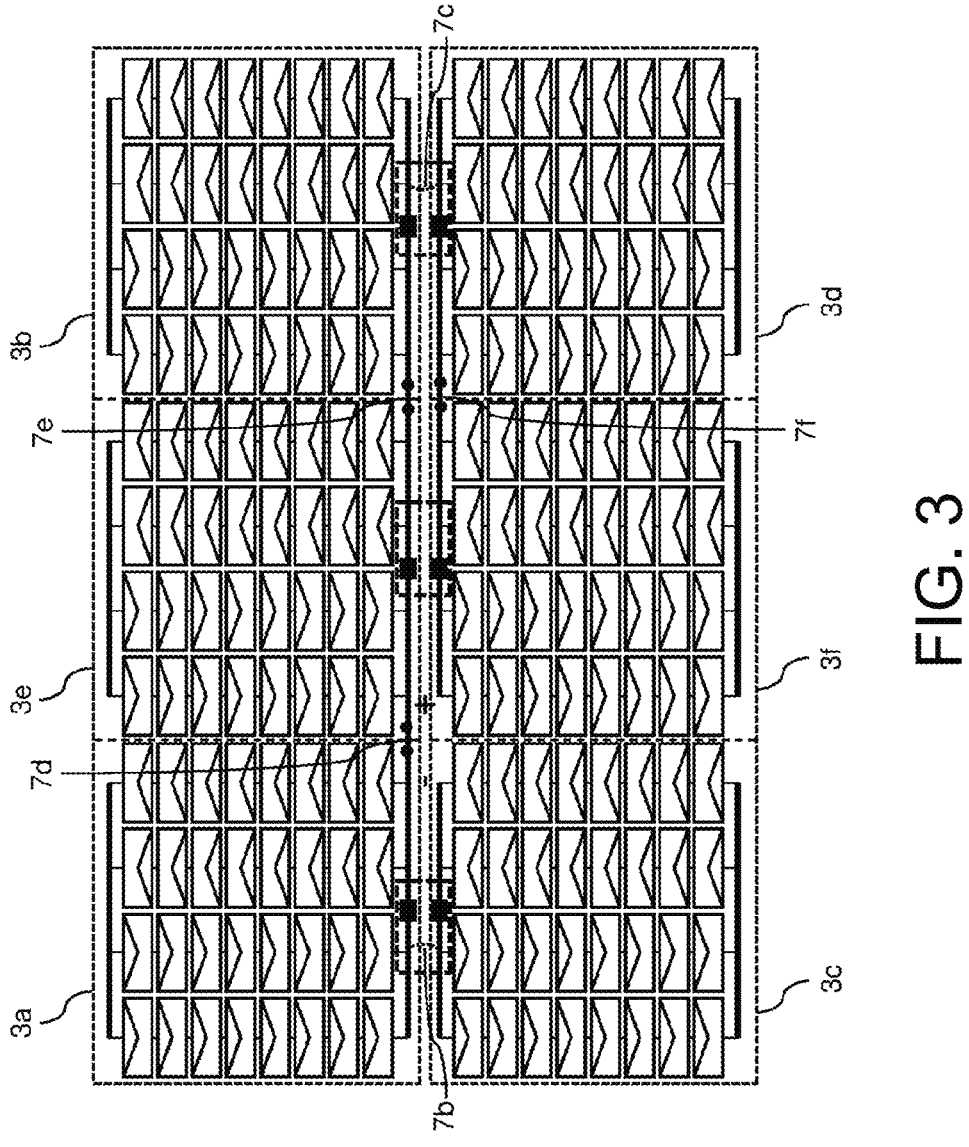

In the exemplary embodiment shown in FIG. 3, the module segments 3a and 3d each have a further module segment 3e and 3f. The further module segment 3e is electrically conductively connected to the module segment 3a via the segment connector 7d and to the module segment 3b by way of the segment connector 7e. The further module segment 3f is electrically conductively connected to the module segment 3d via the segment connector 7f. The module segment 3a is electrically conductively connected to the module segment 3c via the segment connector 7b. The module segment 3b is electrically conductively connected to the module segment 3d via the segment connector 7c.

The module segment 3e is arranged between the module segments 3a and 3b.

The module segment 3f is arranged between the module segments 3c and 3d.

In a modified exemplary embodiment of the exemplary embodiment shown in FIG. 3, the module segments 3a and 3c each have a further module segment 3e and 3f. The further module segment 3e is connected to module segment 3a via the segment connector 7d. The further module segment 3f is electrically conductively connected to the module segment 3d via the segment connector 7f and electrically conductively connected to the module segment 3c by way of the segment connector 7e. The module segment 3a is electrically conductively connected to the module segment 3c via the segment connector 7b. The module segment 3b is electrically conductively connected to the module segment 3d via the segment connector 7c.

The module segment 3e is arranged between the module segments 3a and 3b.

The module segment 3f is arranged between the module segments 3c and 3d.

In a further modified exemplary embodiment of the exemplary embodiment shown in FIG. 3, the module segments 3b and 3c each have a further module segment 3e and 3f. The further module segment 3e is connected to module segment 3b via the segment connector 7d. The further module segment 3f is electrically conductively connected to the module segment 3d via the segment connector 7f and electrically conductively connected to the module segment 3c by way of the segment connector 7e. The module segment 3a is electrically conductively connected to the module segment 3c via the segment connector 7b. The module segment 3b is electrically conductively connected to the module segment 3d via the segment connector 7c.

The module segment 3e is arranged between the module segments 3a and 3b.

The module segment 3f is arranged between the module segments 3c and 3d.

In a further modified exemplary embodiment of the exemplary embodiment shown in FIG. 3, the module segments 3a and 3c each have a further module segment 3e and 3f. The further module segment 3e is electrically conductively connected to the module segment 3a via the segment connector 7d and to the module segment 3b by way of the segment connector 7e. The further module segment 3f is electrically conductively connected to the module segment 3c via the segment connector 7f. The module segment 3a is electrically conductively connected to the module segment 3c via the segment connector 7b. The module segment 3b is electrically conductively connected to the module segment 3d via the segment connector 7c.

The module segment 3e is arranged between the module segments 3a and 3b.

The module segment 3f is arranged between the module segments 3c and 3d.

This results, in the exemplary embodiment of FIG. 3 and the modifications, as also shown in FIG. 2, in the advantage that expansion of the configuration shown in exemplary embodiment 1 can be implemented in a structurally simple manner by adding module segments.

Figure 4:
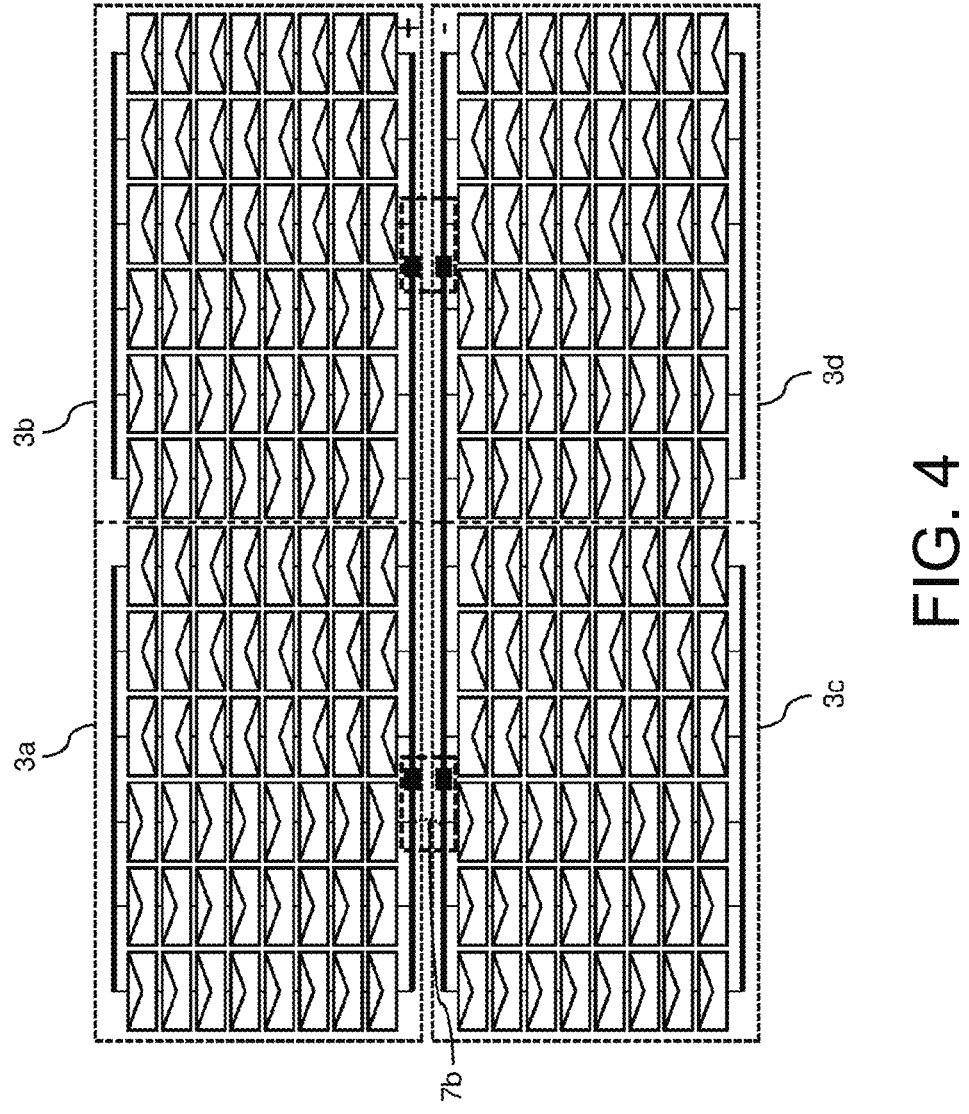

In the exemplary embodiment shown in FIG. 4, the module segments 3b and 3d do not have an electrically conductive connection. In contrast to the exemplary embodiment described in FIG. 1, the module segment is electrically conductively connected to the module segment 3c via the segment connector 7b.

In a modified exemplary embodiment of the exemplary embodiment shown in FIG. 4, the module segments 3a and 3c do not have an electrically conductive connection. In contrast to the exemplary embodiment described in FIG. 1, the module segment 3b is electrically conductively connected to the module segment 3d via the segment connector 7b.

This has the advantage that only one cross-row segment connector is required for the configuration shown.

Figure 5A:
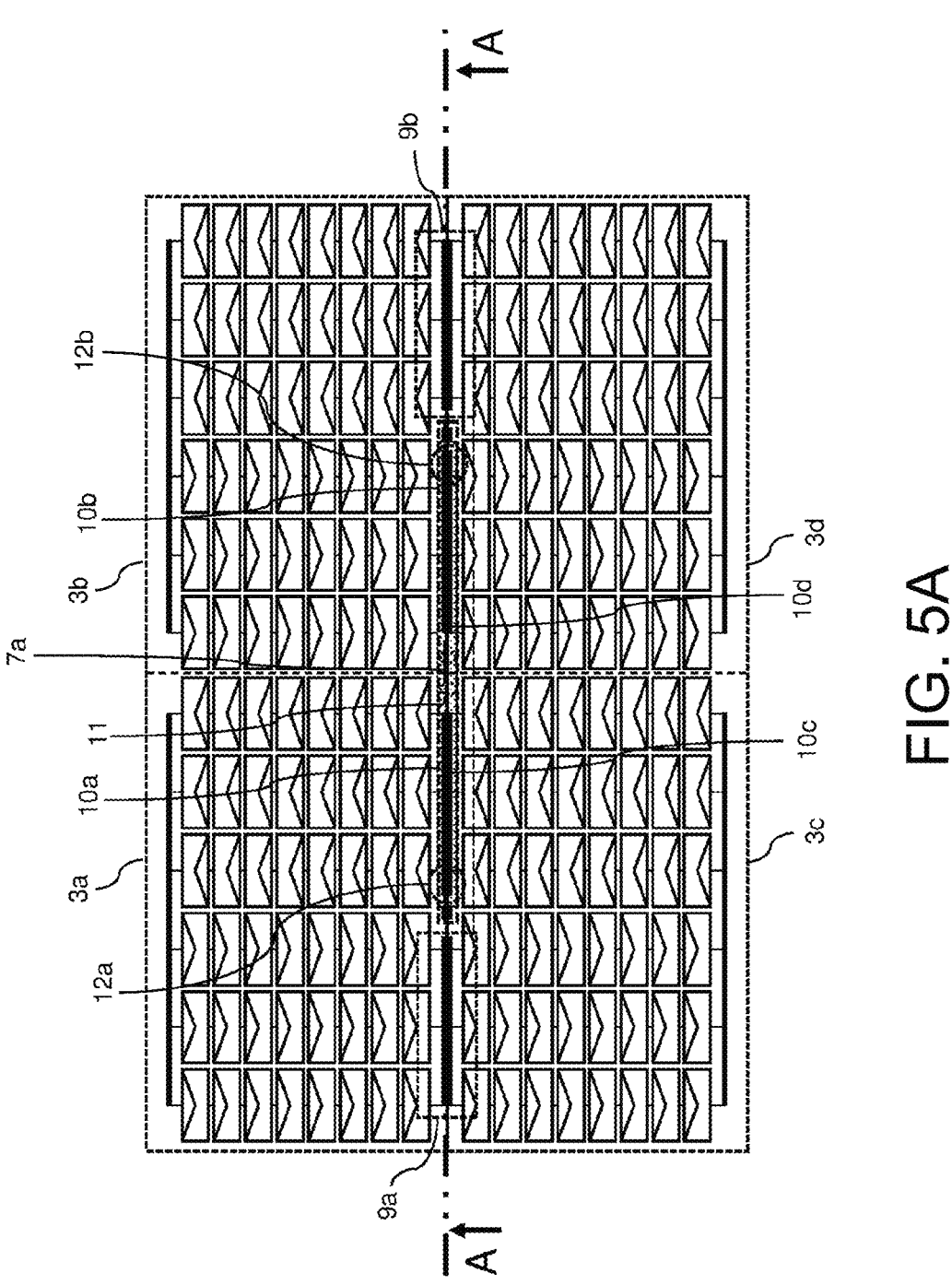

The exemplary embodiment which is shown in FIG. 5A has no further segment connectors in addition to 7a, two row bars 9a and 9b taking over the function of the cross-row segment connectors. The module segment 3a is electrically conductively connected to the module segment 3c via the row bar 9a. The module segment 3b is electrically conductively connected to the module segment 3d via the row bar 9b. The row bars 9a and 9b are arranged within the encapsulation here. The string connectors 10a and 10b of the module segments 3a and 3b are arranged in a first plane E1 within the laminate and are electrically conductively connected via a segment connector 7a, which is also located in this plane. The string connectors 10c and 10d of the module segments 3c and 3d are arranged in a second plane E2 within the encapsulation. The plane 2 is spaced from the first plane E1. The insulation layer 11 is arranged between the planes E1 and E2. The embodiment shown comprises two contact feedthroughs 12a and 12b, these contact feedthroughs 12 enabling contacting of the connectors located in the encapsulation 13. The connectors routed to the outside are interconnected with the bypass elements 4 within the junction boxes.

Figure 5B:
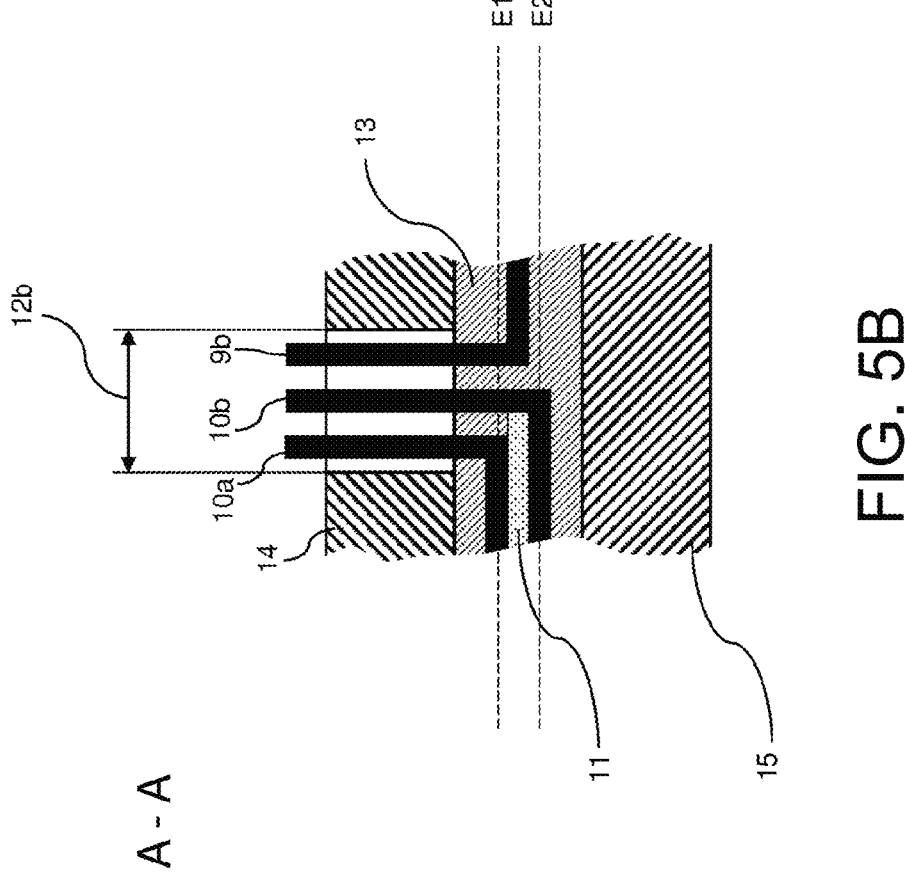

FIG. 5B shows a detail of a section along the section line A-A from FIG. 5a. This figure illustrates the position of the individual planes E1 and E2, the insulation layer 11 of the encapsulation 13, the positioning of the contact feedthrough 12, and also the front side 15 and rear side 14 of the module.

These connectors arranged one above the other result in the advantage that result in the advantage that the surface utilization is improved, this leading to an increase in efficiency.

Figure 6:
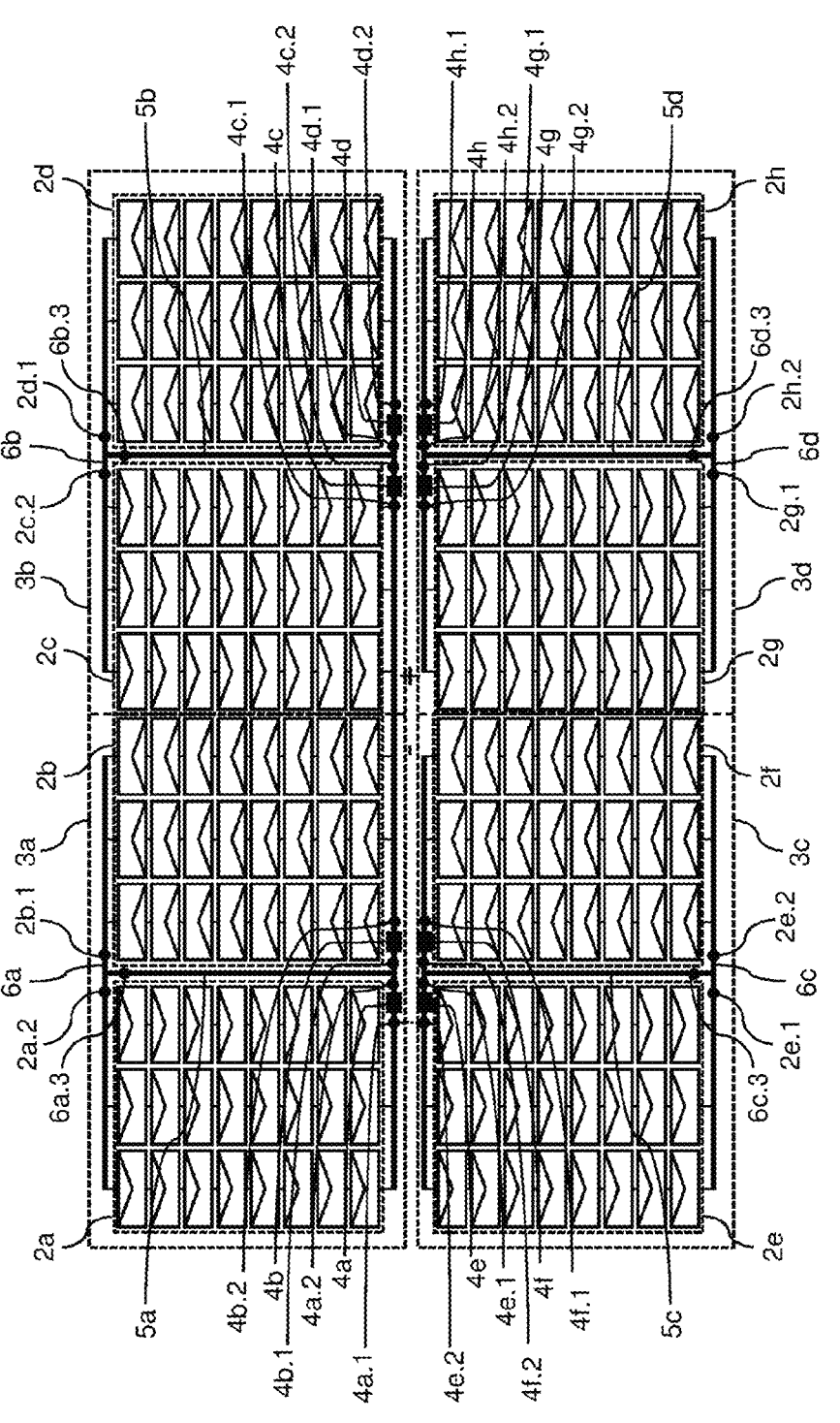

In the exemplary embodiment shown in FIG. 6, the module segments 3a to 3d each have two bypass elements 4.

The pole 4b.2 of the bypass element 4b is electrically conductively connected to the pole 2b.2 of the subsegment 2b. The poles 4a.2 and 4b.1 are electrically conductively connected to the contact 6a.3 of the subsegment connector 6a via the bypass connector 5a.

The pole 4c.1 of the bypass element 4c is electrically conductively connected to the pole 2c.1 of the subsegment 2c. The pole 4d.2 of the bypass element 4d is electrically conductively connected to the pole 2d.2 of the subsegment 2d. The poles 4c.2 and 4d.1 are electrically conductively connected to the contact 6b.3 of the subsegment connector 6b via the bypass connector 5b.

The pole 4f.1 of the bypass element 4f is electrically conductively connected to the pole 2f.1 of the subsegment 2f. The pole 4e.2 of the bypass element 4e is electrically conductively connected to the pole 2e.2 of the subsegment 2e. The poles 4f.2 and 4e.1 are electrically conductively connected to the contact 6c.3 of the subsegment connector 6c via the bypass connector 5c.

The pole 4h.1 of the bypass element 4h is electrically conductively connected to the pole 2h.1 of the subsegment 2h. The pole 4g.2 of the bypass element 4g is electrically conductively connected to the pole 2g.2 of the subsegment 2g. The poles 4h.2 and 4g.1 are electrically conductively connected to the contact 6d.3 of the subsegment connector 6c via the bypass connector 5d.

It is advantageous in this embodiment that the connection by means of the bypass connector 5 results in a reduction in the expenditure on material due to the combination of the otherwise required individual connections of the bypass elements to the subsegment connector. Using such connectors, it is possible to secure small partial segments with a bypass in order to thereby reduce partial shading losses. In addition, the use of a bypass connector allows for a more flexible arrangement of the bypass elements on the solar module. In addition, this arrangement reduces the risk of hotspots caused by relatively short solar cell strings. It is additionally advantageous that the voltage load on the bypass elements is reduced in the case of bridging.

LIST OF REFERENCE SIGNS

1 Solar cell string
2 Subsegment
3 Module segment
4 Bypass element
5 Bypass element connector
6 Subsegment connector
7 Segment connector
8 Solar cell
9 Row connector
10 String connector
11 Insulation layer
12 Contact feedthrough
13 Encapsulation
14 Rear side
15 Front side
16 Current direction

The invention claimed is:

1. A solar cell module, comprising:

at least four module segments connected in series via segment connectors, each of the module segments has at least two subsegments which are connected in series via a subsegment connector, the subsegments each have at least one first solar cell string having a plurality of solar cells connected in series, the solar cells of the solar cell module are arranged such that the solar cell module forms a relatively short edge and a relatively long edge, wherein each of the subsegments has the first solar cell string and at least a second solar cell string, the first and second solar cell strings of each of the subsegments are connected in parallel by an internal string connector and an external string connector, wherein the first and the second solar cell strings each have a plurality of the solar cells connected in series, the solar cell strings extend parallel to the short edge of the solar cell module, the at least four module segments are arranged in a matrix which has at least two rows and at least two columns, wherein each of the rows and each of the columns has at least two of the at least four module segments, and the subsegments of the module segments with alternating current directions are arranged in each said row, so that subsegments situated next to each other in a row have opposite current directions, wherein the sequence of current directions of the subsegments is the same in the first and the second row.

2. The solar cell module as claimed in claim 1, wherein the module segments each have a bypass element, which is connected in parallel with the subsegments of the module segment.

3. The solar cell module as claimed in claim 1, wherein a plurality of the external string connectors and the subsegment connectors are arranged in an edge region of the solar cell module, and a plurality of the internal string connectors and the segment connectors are arranged in a central module region.

4. The solar cell module as claimed in claim 3, wherein the segment connectors, which interconnect the module segments of two adjacent ones of the rows in series, are additionally formed as the internal string connectors of the interconnected subsegments of the respective module segments.

5. The solar cell module as claimed in claim 3, wherein the internal string connectors and internal segment connectors of the module segments of a first row are arranged on a first plane, and the internal string connectors of a second row are arranged on a second plane, which is spaced from the first plane, and are separated from each other via an electrically non-conductive insulation layer.

6. The solar cell module as claimed in claim 5, further comprising a plurality of contact feedthroughs in order to enable contacting of the connectors through the planes to a rear side of the solar module.

7. The solar cell module as claimed in claim 1, wherein the module segments each have a first and an at least second bypass element, each of which has a first pole and a second pole, the first pole of the first bypass element of one said module segment is connected to a first pole of the first subsegment of the module segment, and the second pole of the second bypass element of the module segment is electrically conductively connected to a second pole of the second subsegment of the module segment, and the second pole of the first bypass element of the module segment and the first pole of the second bypass element of the first module segment are electrically conductively connected to the subsegment connector of the module segment by a bypass connector.

8. The solar cell module as claimed in claim 7, wherein a plurality of the bypass elements, which electrically connect adjacent module segments of a one of the columns to each other, are positioned in junction boxes.

9. The solar cell module as claimed in claim 1, wherein number of the module segments of the first row corresponds to a number of the module segments of a further one of the rows and/or further rows.

10. The solar cell module as claimed in claim 9, wherein the solar cell strings of one said subsegment of one said module segment have the same number of solar cells as the solar cell strings of the further subsegments of the module segment, and the module segments connected via segment connectors have the same number of solar cell strings and the solar cell strings each have the same number of solar cells.

11. The solar cell module as claimed in claim 1, wherein the module segments are arranged next to each other in parallel and the subsegments of the module segments are connected electrically in series at an edge region of the solar module, and the module segments are connected electrically in series in a region not located at the edge of the solar module.

12. The solar cell module as claimed in claim 1, wherein four of the module segments are arranged in the first row and are each interconnected in series via the segment connectors, four of the module segments are arranged in the second row, wherein in each case two of the four module segments are interconnected in series via the segment connectors, and the module segments of the first and last columns of the rows are connected in series via the segment connectors.

13. The solar cell module as claimed in claim 1, wherein three of the module segments are arranged in the first row and are each interconnected in series via the segment connectors, three module segments are arranged in the second row, wherein two of the three module segments are interconnected in series via the segment connectors, and the module segments of the first and last columns of the rows are connected in series via the segment connectors.

14. The solar cell module as claimed in claim 1, wherein two of the module segments are arranged in the first and second rows and are each interconnected in series via the segment connectors, and the module segments of the first and last columns of the rows are connected in series via the segment connectors.

15. The solar cell module as claimed in claim 5, wherein the first and second planes are arranged within the encapsulation material, and the internal string connectors of the second row are arranged so as to overlap with the internal string connectors and the internal segment connectors.

16. The solar cell module as claimed in claim 8, wherein the bypass elements which are associated with the module segments which belong to the same column are positioned in the junction boxes.

17. The solar cell module as claimed in claim 11, wherein the subsegments of the module segments are connected electrically in series by the subsegment connectors.

* * * * *